United States Patent [19]

Schweitzer, Jr.

[11] Patent Number: 4,794,332

[45] Date of Patent: Dec. 27, 1988

[54] FAULT INDICATOR HAVING IMPROVED TRIP INHIBIT CIRCUIT

[76] Inventor: Edmund O. Schweitzer, Jr., 2433 Center St., Northbrook, Ill. 60062

[21] Appl. No.: 845,591

[22] Filed: Mar. 28, 1986

[51] Int. Cl.⁴ ............................................. G01R 19/14
[52] U.S. Cl. ................................. 324/133; 324/522; 324/509; 340/664
[58] Field of Search ............... 324/133, 509, 512, 522; 340/664, 654, 662; 361/94, 110, 59, 87

[56] References Cited

U.S. PATENT DOCUMENTS

| | | |
|---|---|---|
| 3,733,595 | 5/1973 | Benedict . |
| 3,735,248 | 5/1973 | Reese ................................ 340/664 |
| 3,969,710 | 7/1976 | Arima . |
| 3,991,366 | 11/1976 | Schweitzer, Jr. . |
| 4,007,456 | 2/1977 | Paige et al. . |
| 4,063,171 | 12/1977 | Schweitzer, Jr. . |
| 4,152,643 | 5/1979 | Schweitzer, Jr. . |
| 4,234,847 | 11/1980 | Schweitzer . |
| 4,251,770 | 2/1981 | Schweitzer, Jr. . |
| 4,263,550 | 4/1981 | Schweitzer, Jr. . |
| 4,345,242 | 8/1982 | Ienna-Balistreri . |
| 4,424,512 | 1/1984 | Schweitzer, Jr. . |
| 4,438,473 | 3/1984 | Cawley ................................ 361/93 |
| 4,550,288 | 10/1985 | Schweitzer, Jr. . |
| 4,641,220 | 2/1987 | Schweitzer ........................ 324/133 |
| 4,686,518 | 8/1987 | Schweitzer ........................ 324/133 |

Primary Examiner—Reinhard J. Eisenzopf
Assistant Examiner—Jose M. Solis
Attorney, Agent, or Firm—Lockwood, Alex, FitzGibbon & Cummings

[57] ABSTRACT

A fault indicator for indicating the occurrence of a fault current in a monitored conductor includes an electrically actuated indicator flag. Trip circuitry within the fault indicator conditions the indicator flag from a normal reset-indicating state to a fault-indicating state upon the occurrence of a fault current in the conductor. Improved high impedance trip inhibiting circuitry inhibits the trip function following a loss of voltage in the conductor whereby the fault indicator is rendered insensitive to inrush current during a period immediately following restoration of power to the system.

20 Claims, 5 Drawing Sheets

FIG. 3
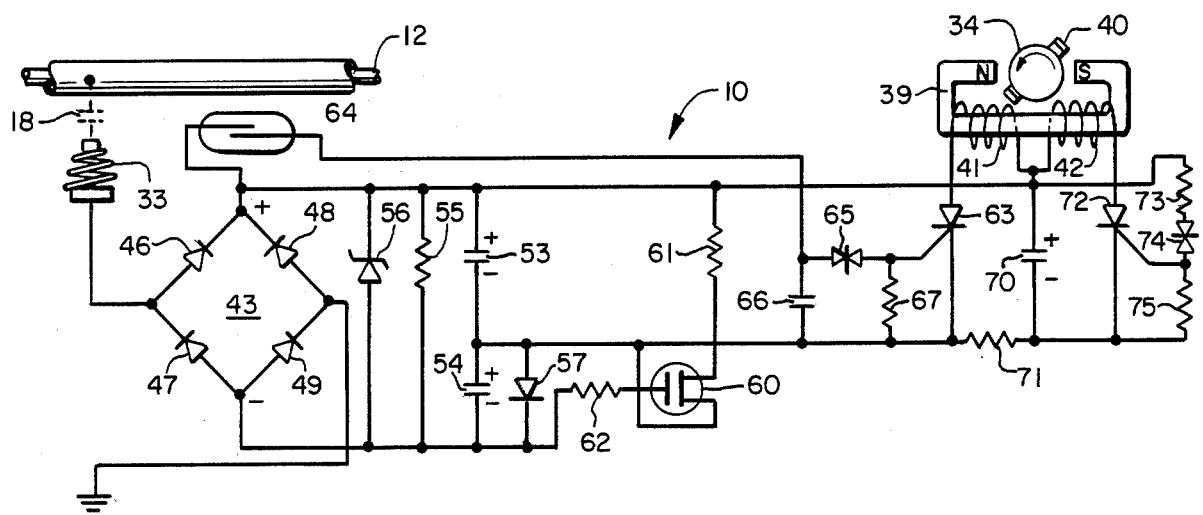
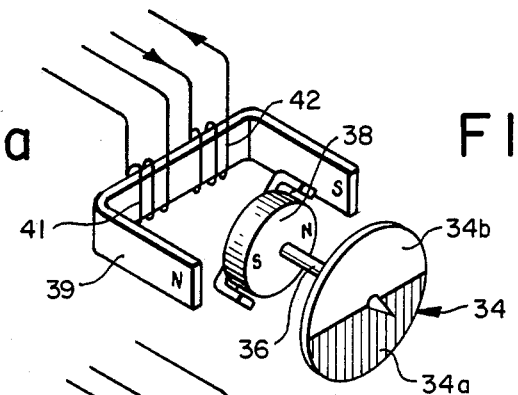
FIG. 4a
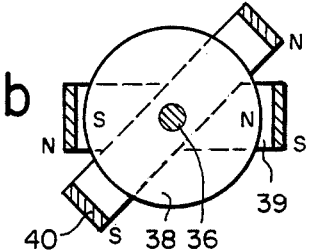
FIG. 4b
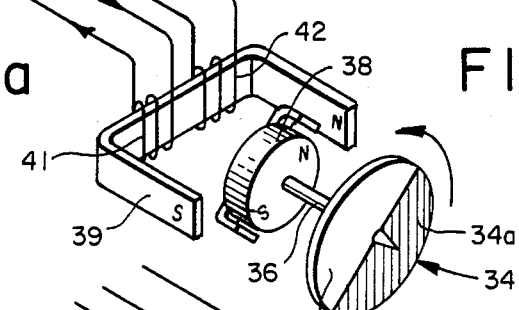
FIG. 5a
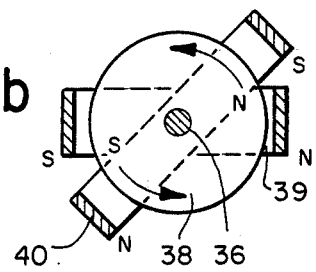
FIG. 5b
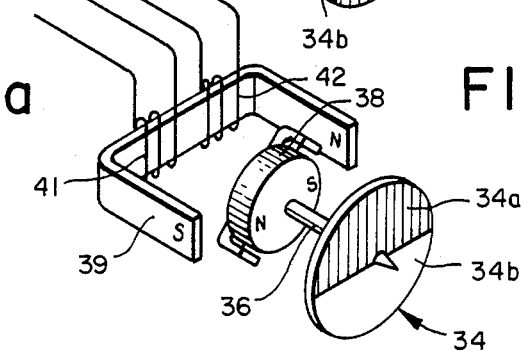
FIG. 6a
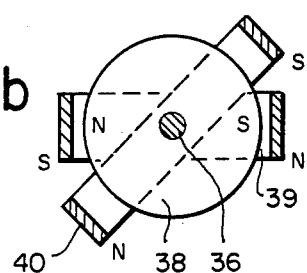
FIG. 6b FIG. 10
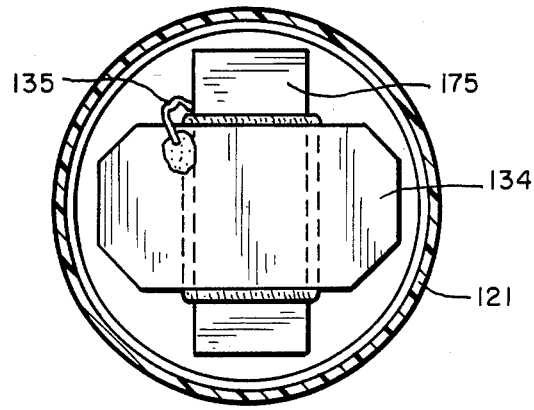
FIG. 11
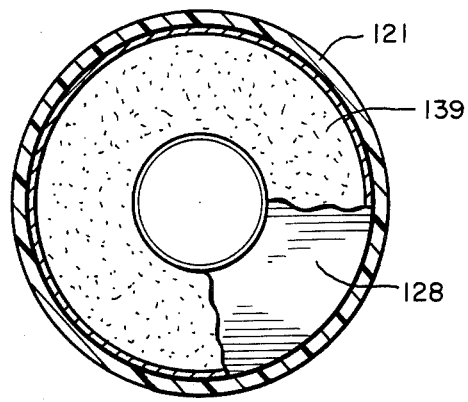
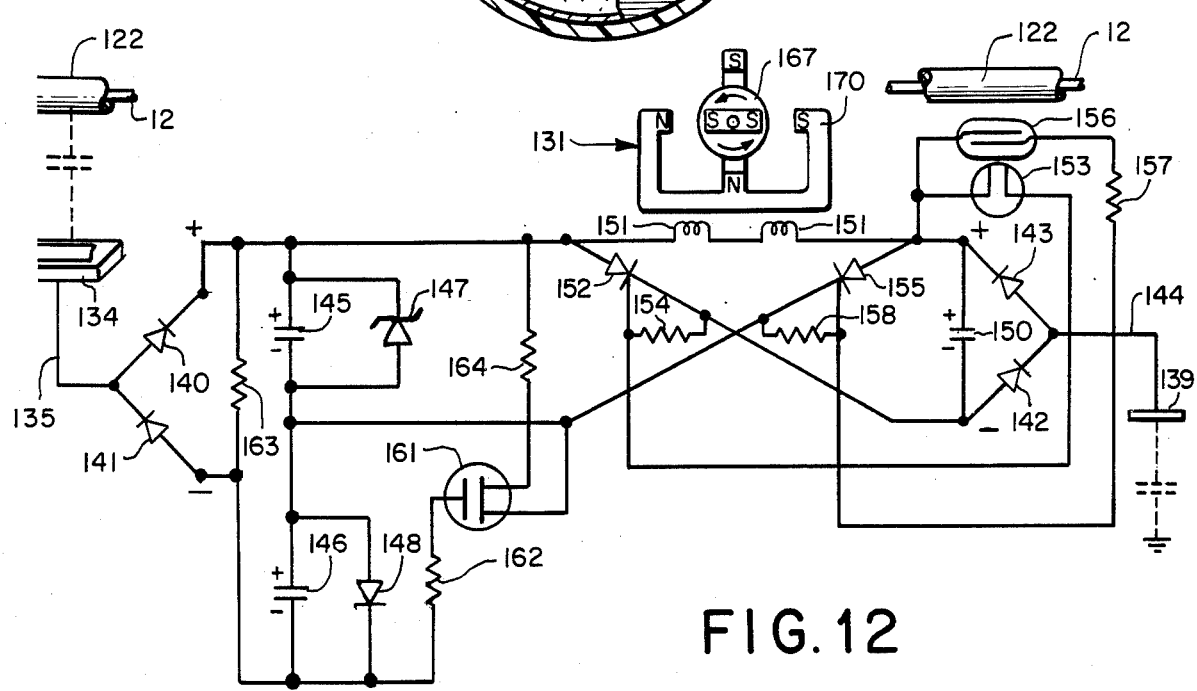
FIG. 12

FAULT INDICATOR HAVING IMPROVED TRIP INHIBIT CIRCUIT

BACKGROUND OF THE INVENTION

The present invention relates generally to fault indicators for alternating current electrical distribution systems, and more particularly to fault indicators having improved high impedance trip inhibiting circuitry wherein the indicators are disabled for a predetermined period of time following power-up of a monitored conductor.

Fault indicators of various types have been constructed for detecting faults in electrical power distribution systems. Such indicators include clamp-on type indicators, which clamp directly over cables in the system, and test point-type indicators, which are mounted on test points provided on connectors or components of the system. Fault indicators of both types may be either of the manually reset type, wherein it is necessary that the indicator be physically reset following each fault, or of the automatically reset type, wherein a fault indication is reset upon restoration of line current. Examples of such fault indicators are found in products manufactured by E. O. Schweitzer Manufacturing Company of Mundelein, Ill., and in U.S. Pat. Nos. 4,063,171, 4,234,847, 4,251,770, 4,236,550 4,438,03 and 4,458,198 of the present inventor.

Since fault conditions in a distribution system may be transitory in nature, as, for example, when a tree branch momentarily contacts a high voltage conductor, distribution circuits are frequently provided with automatic reclosers. In such circuits, the occurrence of a transitory fault results in the circuit interrupter supplying the affected circuit first opening, and then after a short interval trying to reclose to establish power in the circuit. If following reclosure the current is within normal limits, as would be the case if the fault condition was transitory and thus no longer present, the circuit interrupter remains closed and power is distributed through the associated branch of the system. If the fault condition is not transitory, and hence is still present at the time of the automatic recloser cycling, the circuit breaker again trips and after a predetermined number of such attempts power is removed from the circuit.

Upon each cycling of the interrupter, the momentary inrush or initial transient current in the system may exceed normal system current limits. In practice, the inrush current may reach 10 to 20 times the normal steady state current of the conductor and may last for one-half cycle. This may result in fault indicators installed in circuit branches switched by the circuit interrupter but not affected by the original fault condition being falsely trapped.

A fault indicator providing protection against such inrush current is described in the copending application of the present inventor, entitled "Fault Indicator Having Trip Inhibit Circuit", U.S. Pat. No. 4,686,518, issued Aug. 11, 1987. In this indicator, which incorporates loss of voltage circuitry similar to that described in U.S. Pat. No. 4,550,288 of the present inventor, the trip function is disabled for a period immediately following re-energization of the monitored circuit to prevent triggering by the inrush current. The present invention is directed to an improvement in such trip-inhibited fault indicators wherein a high impedance loss of voltage detector circuit, similar to that described in the copending application of the present inventor entitled "Voltage Loss Detector", U.S. Pat. No. 4,714,916, issued Dec. 22, 1987 incorporated in the indicator. As a result, the improved indicator has a substantially higher input impedance and a reduced response and recovery time, making the indicator more suitable for use in demanding situations.

Accordingly, it is a general object of the present invention to provide a new and improved trip-inhibited fault indicator.

It is a more specific object of the present invention to provide a new and improved fault indicator which incorporates improved high impedance circuitry rendering the fault indicator insensitive to inrush current following restoration of current in a monitored conductor.

SUMMARY OF THE INVENTION

The invention is directed to a fault indicator for indicating the occurrence of a fault current in an electrical conductor of an alternating current distribution power system, wherein the conductor is subject to inrush current levels in excess of fault current levels upon power up of the conductor. The indicator includes status indicating means having reset-indicating and fault-indicating states, a trip capacitor, and trip circuit means operable from the trip capacitor for conditioning the status indicating means to the fault-indicating state in response to the occurrence of a fault current in the conductor. The indicator further includes a trip inhibit capacitor, charge circuit means powered by alternating current in the monitored conductor for developing a charge current for charging the trip capacitor to a predetermined charge level, and charge transfer circuit means operable upon interruption of the charge current for transferring a portion of the charge on the trip capacitor to the trip inhibit capacitor, the terminal voltage across the trip inhibit capacitor progressively increasing as the charge is transferred. Trip inhibit circuit means responsive to the voltage across the trip inhibit capacitor increasing beyond a predetermined threshold level discharge the trip capacitor to render the trip circuit means inoperative and the fault indicator non-responsive to inrush current in the conductor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 3 is an electrical schematic diagram of the fault indicator illustrated in FIGS. 1 and 2.

FIGS. 4a and 4b are diagrammatic views of principal indicator components of the fault indicator in a reset state.

FIGS. 5a and 5b are diagrammatic views similar to FIG. 4a and 4b, respectively, showing the indicator components of the fault indicator in transition between a reset state and a tripped state.

FIGS. 6a and 6b are diagrammatic views similar to FIGS. 4a and 4b, respectively, showing the indicator components of the fault indicator in a tripped state.

FIG. 10 is a cross-sectional view taken along line 10—10 of FIG. 9.

FIG. 11 is a cross-sectional view taken along line 11—11 of FIG. 9.

FIG. 12 is an electrical schematic diagram of the fault indicator illustrated in FIG. 8.

DESCRIPTION OF THE PREFERRED EMBODIMENT

Figure 1:
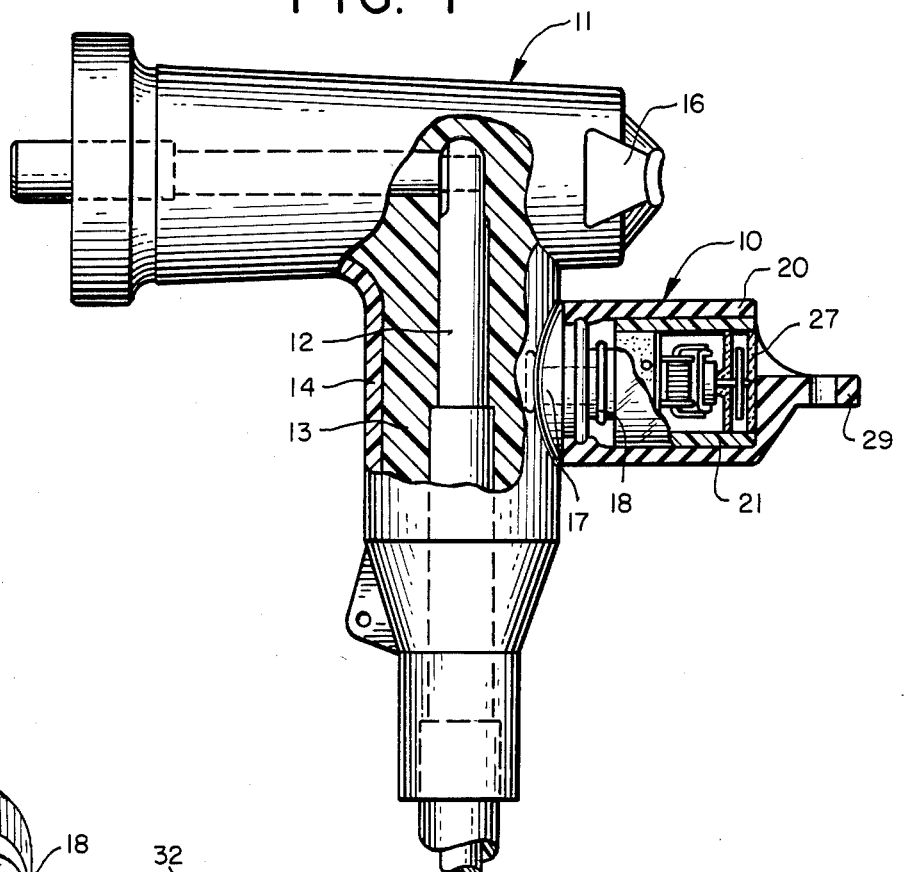
FIG. 1 is a side elevational view, partially in section, illustrating an automatically reset trip-inhibited fault indicator constructed in accordance with the present invention mounted on the test-point terminal of a conventional elbow-type terminal connector.
Figure 2:
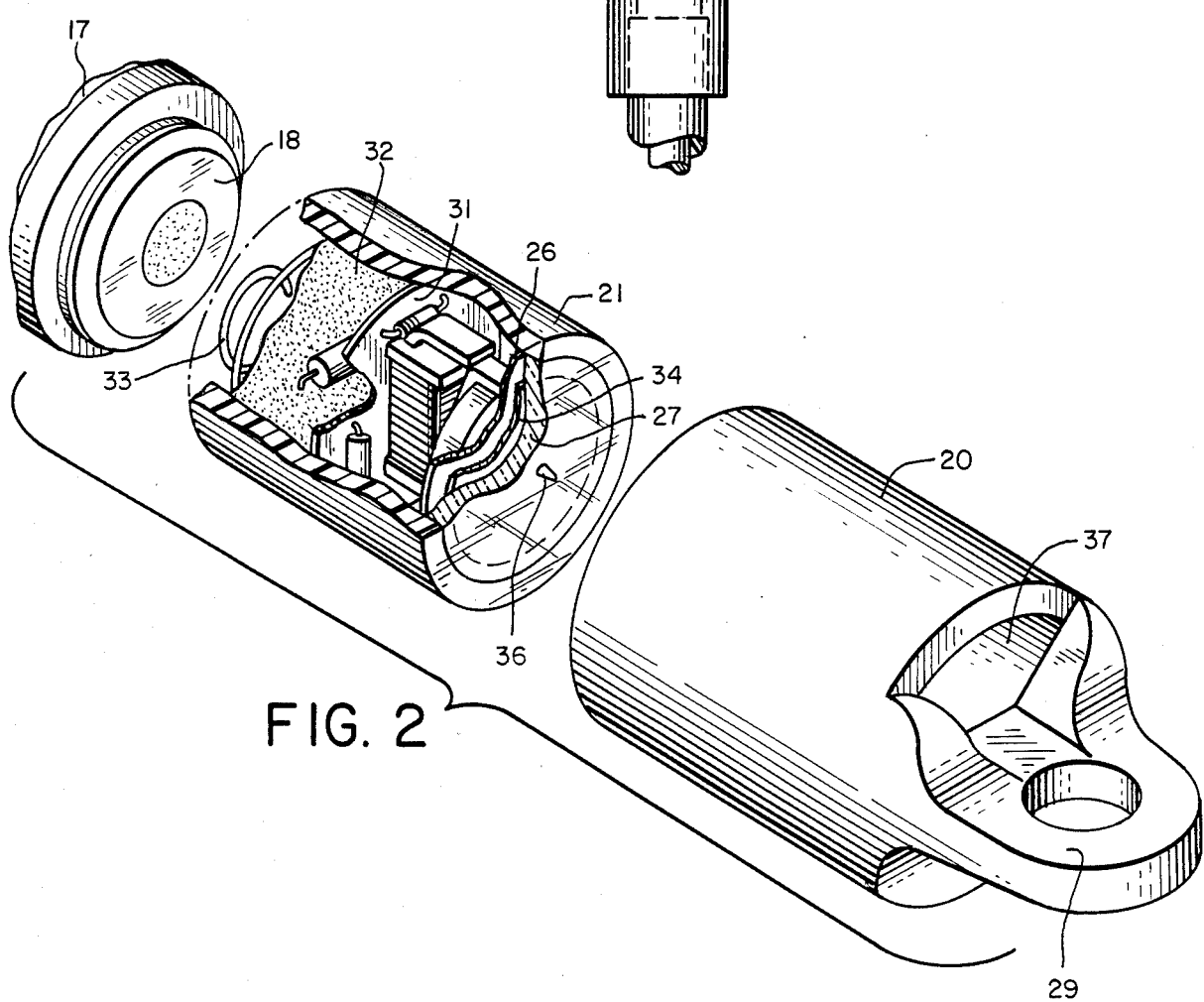
FIG. 2 is a fragmentary perspective view of the fault indicator of FIG. 1 in a partially disassembled state.

Referring to the drawings, and particularly to FIGS. 1 and 2, a trip-inhibited fault indicator 10 constructed in accordance with the invention is shown installed on a plug-in elbow connector 11 of conventional construction for use in high voltage alternating current system for establishing a plug-in connection to a transformer (not shown) or other device. As shown, the connector 11 includes generally an axial conductor 12 extending through an electrically insulating body portion 13 encased in an electrically-conductive sheath 14, the sheath being grounded in accordance with conventional practice. An arcuate member 16 having ends anchored in sheath 14 extends from the connector to receive the hooked end of a lineman's tool commonly used to remove plug-in connectors from such devices.

Elbow connector 11 includes a test point terminal 17 for receiving a circuit condition indicating device, in this case fault current indicator 10. The test point is formed by a portion of the insulating body portion 13, which projects radially through the conductive sheath 14. Embedded in the test point terminal 17 is an electrically conductive contact 18 which is exposed at the outer end of the terminal to provide for an electrical connection to the contact, and an inner portion in proximity to conductor 12 to capacitively couple the contact to the conductor.

The housing of fault indicator 10 includes an electrically conductive semi-flexible rubber outer shell 20 which is open and dimensioned at one end for engaging test point 17. The shell 20 receives a correspondingly sized cylindrical plastic housing 21 in which the electrical components of the fault indicator device are contained. The cylindrical housing includes an integral partition 26 which serves as a mask and spacing element and a transparent end cap 27 which is sonically welded to the end of the housing. At the closed end of shell 20, an apertured tab 29 is provided to facilitate installation and removal of the fault indicator with a conventional hooked lineman's tool.

Referring to FIG. 2, a disc-shaped circuit board 31 is positioned within housing 21 perpendicular to the axis of the housing at a location intermediate the ends thereof. The circuit board, which may be secured in position by an epoxy material 32, serves as mounting means for the electrical components of the fault indicator. An electrical connection is established between this circuitry and test point contact 18 by means of a helical spring 33, the spring being connected at one end to a wire conductor extending from the circuit board, and being resiliently pressed at the other end against contact 18. An electrical ground connection is established to the circuit board by means of an additional electrical conductor compressively wedged between housing 21 and the electrically conductive outer shell 20 grounded through sheath 14.

To provide an indication of the occurrence of a fault current in conductor 12, the fault indicator includes within the lower end of housing 21 a disc-shaped target member 34 which is mounted for rotation on a pivot shaft 36. The face of the target disc has a red segment 34a (FIGS. 4-6) and a white segment 34b, each comprising one-half of the target face, and only one of which is visible at a time through a window 37 provided in shell 20 and the end cap 27 of housing 21.

Secured to and pivotal with target 34 member is a disc-shaped target actuator magnet 38 which is formed of a magnetic material having a high coercive force, such as ceramic, and which is magnetically polarized to form two magnetic poles of opposite magnetic polarity, as indicated in FIGS. 4-6. The actuator magnet 38, and hence the target member 34, are rotated between reset-indicating and fault-indicating positions by rotational forces exerted on the magnet by means of a stationary generally U-shaped magnetic pole piece 39, which is located within housing 21 with the projecting poles thereof diametrically opposed and adjacent the edge of the magnet.

When the fault indicator is in a reset-indicating state, pole piece 39, which is preferably formed of a magnetic material having a relatively low coercive force, such as a chrome steel, is magnetized at its projecting poles to the magnetic polarities indicated in FIGS. 4a-4b. As a result, the opposite polarity magnetic poles of the target magnet are attracted to position the target member 34 as shown. In this position the red segment 34a of the target disc is not visible through window 37, and only white segment 34b is visible to indicate to an observer that the indicator is in a reset condition.

On the occurrence of a fault current in conductor 12, which current may, for example, exceed 400 amperes, pole piece 39, and an adjacent auxiliary pole piece 40 of similar construction, are remagnetized to the magnetic polarities shown in FIGS. 5a-5b and 6a-6b by momentary energization of a trip winding 41 on the center section of pole piece 39. As a result, the poles of magnet 38 are repelled by the adjacent like-magnetic polarity poles of the pole pieces and the target disc is caused to rotate 180° counter-clockwise to the tripped position shown in FIGS. 6a-6b. In this position, the red segment 34b of the target disc is visible through window 37 (FIG. 2) and a lineman viewing the fault indicator is advised that a fault current has occurred in conductor 12.

Targe disc 34 remains in the fault indicating position until the poles of pole pieces 39 and 40 are subsequently remagnetized to the magnetic polarities shown in FIGS. 4a-4b by momentary energization of a reset winding 42 on the center section of the pole piece. As a result, the target magnet 38, and hence the target disc 34, are caused to rotate from the tripped position shown in FIGS. 6a-6b to the reset position shown in FIGS. 4a-4b, and the fault indicator is conditioned to respond to a subsequent fault current.

Energization of trip winding 41 upon occurrence of a fault current in conductor 12, and energization of reset winding 42 upon restoration of current in the conductor following a fault, is accomplished by means of externally-powered circuitry contained within the fault indicator. Referring to the schematic diagram shown in FIG. 3, windings 41 and 42 may be connected end-to-end for independent energization upon occurrence of fault and reset conditions, respectively. Operating power for these windings is obtained by means of a bridge rectifier network 43, consisting of four diodes 46-49. One input terminal of this network, formed at the juncture of the anode of diode 46 and the cathode of diode 47, is connected through the helical spring 33 to test point contact 18. The other input terminal, formed at the anode of diode 47 and the cathode of diode 49, is connected to ground through the electrically conductive outer shell 20 of the fault indicator housing. With this arrangement, high voltage alternating current carried in conductor 12 is capacitively coupled to the bridge rectifier network, resulting in the production of a pulsating unidirectional current at the output terminals of the network.

The positive polarity output terminal of the bridge rectifier network is formed at the cathodes of diodes 46 and 48, and the negative polarity outuut terminal of the rectifier network is formed at the juncture of the anodes of diodes 47 and 49. To provide trip and trip inhibit functions, a trip capacitor 53 and a trip inhibit capacitor 54 are connected in series between the two output terminals to receive charging current from the rectifier network. A resistor 55 and a zener diode 56 are also connected across the network output terminals. A diode 57 is connected across capacitor 54 in a direction forward-biased to the charging current produced by rectifier network 43.

Th juncture of capacitors 53 and 54 is connected to one principal electrode of an enhanced FET-type transistor 60. The remaining principal electrode of transistor 60 is connected through a resistor 61 to the positive polarity output terminal of rectifier network 43. The gate electrode of transistor 60 is connected through a resistor 62 to the negative polarity output terminal of the network.

To provide for energization of trip winding 41 upon occurrence of a fault current in conductor 12, the trip winding is connected to receive discharge current from capacitor 53 through a silicon controlled rectifier (SCR) 63 connected between the winding and the juncture of capacitors 53 and 54. Upon occurrence of a fault current, a reed switch 64, positioned within housing 21 in close proximity to conductor 12 so as to close in response to the magnetic field produced by a fault-level current, causes an enabling signal to be applied from rectifier network 43 through a bilateral diode 65 to the gate electrode of SCR 63 to initiate conduction through the SCR. A capacitor 66 and resistor 67 in the SCR gate circuit provide a slight time delay to the trip function.

To maintain fault indicator 10 in a reset condition in the absence of a fault current, reset winding 42 is periodically energized during normal current flow in conductor 12. To this end, the fault indicator includes a reset capacitor 70 connected to receive current from capacitor 53 through an isolation resistor 71. One terminal of this capacitor is connected to the positive polarity output terminal of bridge rectifier network 43 and the other terminal is connected through resistor 71 to the juncture of capacitors 53 and 54. With this arrangement, as trip capacitor 53 is charged by bridge rectifier network 43, reset capacitor 70 is charged through resistor 71, but at a lesser rate. The remaining terminal of reset winding 42 is connected through a silicon controlled rectifier (SCR) 72 to capacitor 70 such that upon SCR 72 being conditioned for conduction the capacitor is discharged through the winding.

Periodic conduction through SCR 72 is obtained by connecting the gate electrode of that device to the positive polarity output terminal of bridge rectifier 43 through a resistor 73 and bilateral diode 74, and to the cathode of the SCR through a resistor 75. Under normal current flow conditions, as trip capacitor 53 is charged by the pulsating direct current output of bridge rectifier network 43, reset capacitor 70 is charged through resistor 71. The voltage developed across capacitor 70 progressively increases with time, until the threshold voltage of bilateral diode 74 is reached, at which time conduction is initiated through SCR 72 and capacitor 70 discharges through winding 42. Resistor 71 prevents trip capacitor 53 from being discharged with capacitor 70, leaving this capacitor available for powering the trip circuit. With the periodic energization of winding 42 magnetic pole assembly 39 is magnetized as shown in FIGS. 4a-4b, and the flag indicator 34 is positioned as shown to indicatte a reset mode.

In practice, the breakdown voltage of bilateral diode 74 may be in order of 34 volts, and the time required for capacitor 70 to reach this threshold level with a typical voltage level of 4,400 volts on conductor 12 may be approxiamtely 2 minutes or less. The voltage level within conductor 12 is not critical to the operation of the reset circuit, and has only the effect of changing the repetition rate of the reset cycle.

Upon occurrence of a fault current in conductor 12 trip capacitor 53 is discharged through SCR 63 and trip winding 41. The resulting magnetic flux in the pole piece 39 reverses the magnetic polarities of the pole piece and causes rotation of the indicator flag to a trip-inhibiting position as previously described. In particular, the magnetic polarities of pole piece 39 are reversed as shown in FIGS. 5a-5b, causing the magnetic poles of the pole piece to repel the like poles of magnet 38 and induce a 180° rotation of target member 34. The auxiliary pole piece 40 assists in this rotation.

To preclude the possibility of false fault current indications caused by momentary current surges upon restoration of current in an interrupted circuit, as upon automatic reclosure cycling, a trip inhibit feature is provided to disable the fault indicator for a predetermined period of time following re-energization of the conductor after a loss of voltage. To this end, in the presence of voltage on conductor 12 the voltage developed across trip inhibit capacitor 54 by the pulsating charge current developed by bridge rectifier network 43 is limited to the forward voltage drop of diode 57. By reason of resistor 62, this limited voltage appears as a reverse bias on the gate electrode of transistor 60, causing that device to be codditioned to a non-conductive state. Consequently, the transistor and resistor 61 have no effect on the charge contained on trip capacitor 53.

However, upon loss of voltage on conductor 12, and the consequent absence of output from bridge rectifier network 43, a portion of the charge contained in trip capacitor 53 is transferred through resistor 55 to trip inhibit capacitor 54, causing that capacitor to be rapidly charged in a reverse direction. As the capacitor receives the charge the voltage across the capacitor reverses polarity, and progressively increases in a reverse direction which tends to bias FET transistor 60 into conduction. Eventually the threshold level required for conduction in transistor 60 is reached, and that device is rendered conductive. This causes capacitor 53 to be discharged through resistor 61, rendering the trip circuit inoperative. Since the charge transfer between capacitor 53 and capacitor 54 takes place relatively quickly, typically in the order of 0.1 second, and resistor 61 has a relatively low resistance, trip capacitor 53 is discharged almost immediately following a voltage loss in the monitored conductor. Trip inhibit capacitor 54 is eventually also discharged through resistor 61.

The absence of charge in capacitor 53 precludes operation of the trip circuit, since it is this charge that is required to actuate winding 41. Consequently, the fault indicator is desirably rendered inoperative for the detection and indication of fault currents following a voltage loss in conductor 12. Upon restoration of voltage in the conductor, capacitors 53 and 54 are again charged by the pulsating unidirectional current from bridge rectifier network 43. Since transistor 60 is rendered non-conductive at this time by the reverse-bias forward voltage drop of diode 57 appearing across trip inhibit capacitor 54 and applied to the transistor control electrodes, trip capacitor 53 is quickly recharged to its quiescent charge state and the trip circuit becomes operative. At the same time, reset capacitor 70 is charged through resistor 71, rendering the reset circuit operative.

In a typical embodiment intended for use with 4400 volt 60 hertz alternating current capacitor 53 may have a value of 1 microfarad and capacitor 54 may have a value of 0.01 microfarad. Resistor 55 may have a value of 50 megohms and zener diode 56 may have a threshold voltage of 50 volts. These component values result in trip capacitor 53 having a discharge time constant of approximately 0.1 second. Transistor 60 may comprise a type IR 1Z3 enhanced FET, resistor 61 may have a value of 220 ohms, and resistor 62 may have a value of approximately 50 megohms.

Figure 7:
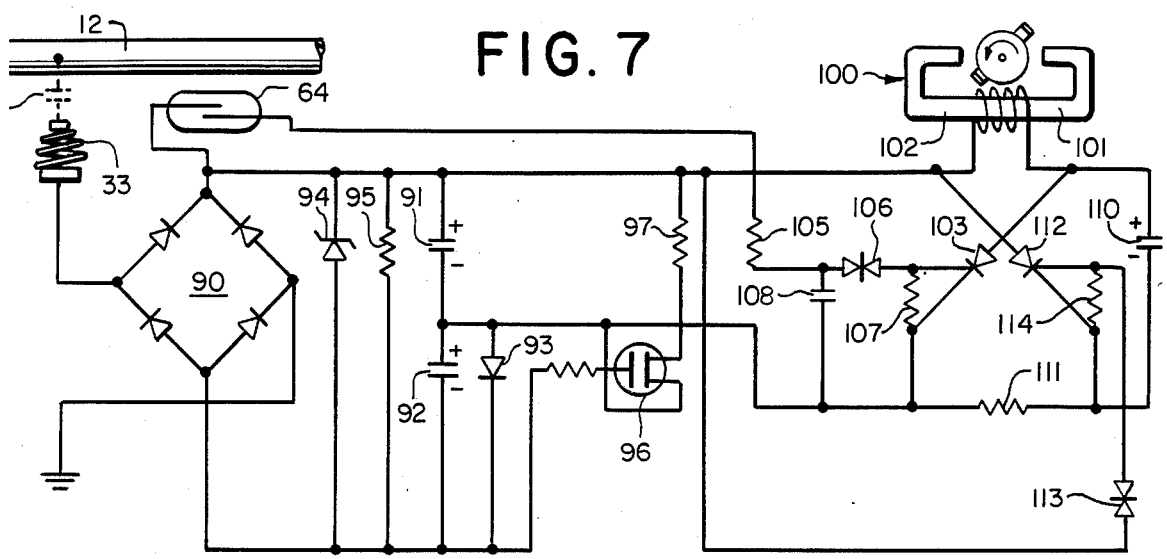
FIG. 7 is an electrical schematic diagram of an alternate single-winding circuit for use in the fault indicator illustrated in FIG. 1.
Figure 8:
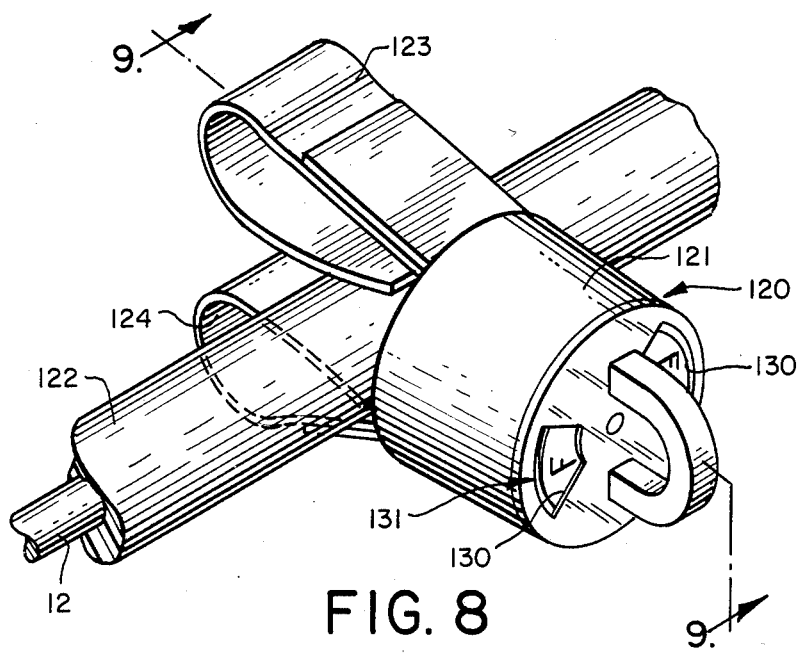
FIG. 8 is a perspective view illustrating a trip-inhibited fault indicator constructed in accordance with the present invention installed on a high voltage cable of a power distribution system.

An alternate circuit for fault indicator 10 suitable for use with a single-winding type flag indicator assembly is shown in FIG. 7. In this embodiment, test point 18 is connected through spring contact 33 to one input terminal of a bridge rectifier network 90. The other input terminal of network 90 is connected to ground through the electrically conductive sheath 14 of elbow connector 11. In the presence of a high voltage alternating current on conductor 12 rectifier network 90 develops a pulsating direct current across a trip capacitor 91 and a trip inhibit capacitor 92. A forward-biased diode 93 limits the voltage across capacitor 92 to the forward voltage drop of the diode, and a zener diode 94 connected across the output terminals of the rectifier network limits the voltage developed by the network.

Upon loss of excitation a portion of the charge developed in capccitor 91 is transferred through a resistor 95 into trip inhibit capacitor 92, causing the voltage across that device to reverse in polarity and progressively increase in the reverse direction as the capacitor is charged. Eventually the threshold voltage of an enhanced FET-type transistor 96 having control electrodes connected across capacitor 92 is reached, and the transistor becomes conductive and causes trip capacitor 91 to discharge through a resistor 97 to render the trip circuit of the fault indicator inoperative. The trip circuit remains inoperative for a predetermined period of time following restoration of current in conductor 12 dependent on the time required to recharge trip capacitor 91 sufficiently to provide operating power for the trip circuit.

A single-winding flag indicator assembly 100 of the fault indicator includes a single combined trip and reset winding 101 on a U-shaped magnetic pole piece 102. Upon occurrence of a fault current in conductor 12 a trip-conditioning current is supplied in a first direction to winding 101 from trip capacitor 91 through a first silicon controlled rectifier (SCR) 103. Conduction through SCR 103 results from closure of reed switch contacts 64 by the magnetic field accompanying the fault current, causing an initiating current to be supplied to the control electrode of SCR 103 through a gate circuit comprising a resistor 105, a bilateral diode 106, a resistor 107 and a capacitor 108.

To provide for periodic reset of the flag indicator assembly 100 the single-winding fault indicator of FIG. 7 includes a reset capacitor 110 which is maintained in a charged condition by charging current provided from trip capacitor 91 through a resistor 111. Capacitor 110 is periodically discharged in an opposite direction through the combined trip and reset winding 101 by means of an SCR 112, which is conditioned into conduction on the terminal voltage across the capacitor exceeding the threshold voltage of the SCR gate circuit comprising a bilateral diode 113 and a resistor 114.

In the presence of voltage on conductor 12, reset capacitor 110 periodically charges through resistor 111 until the threshold voltage of bilateral 113 is reached, and then discharges through winding 101 to provide a reset pulse to flag indicator assembly 100. Once capacitor 110 has discharged, SCR 112 is again rendered nonconductive and the reset capacitor again charges through resistor 111 to begin the cycle anew. The relatively high resistance of resistor 111 assures that sufficient charge will be available on capacitor trip 91 notwithstanding the discharge of capacitor 110 to initiate a reset.

While the trip-inhibited fault indicator of the invention has been shown in conjunction with single and double flag indicator assemblies of a conventional rotating indicator flag construction, it will be appreciated that the invention can be used with other types of indicators having other types of indicating elements. For example, the invention can be utilized in conjunction with a magnetic test point type indicator such as that described in U.S. Pat. No. 4,458,198 of the present inventor, or in conjunction with various types of electronic readouts which are conditioned between reset and fault identifying states by application of a momentary current.

An alternate embodiment of the invention suitable for mounting directly to a high voltage cable of a power distribution system is shown in FIGS. 8-12. As shown, this fault indicator 120 includes a generally cylindrical housing 121 formed of a hard electrically insulating weather-resistant material such as LEXAN a trademark of GEneral Electric Company, of Schenectady, N.Y.). The detector 120 is secured to a conventional high voltage cable 122 including an internal conductor 12 by means of a pair of resilient inwardly-biased non-electrically conductive retaining arms 123 and 124. The retaining arms, which project rearwardly from housing 121, include end portions 123a and 124a, respectively, which are inwardly formed so as to grasp and hold cable 122 in close proximity to the rear wall 125 (FIG. 9) of housing 121. A pair of semi-resilient stiffening members 126 and 127 may be provided in close association with members 123 and 124 to assist in biasing the retaining members against cable 122.

Figure 9:
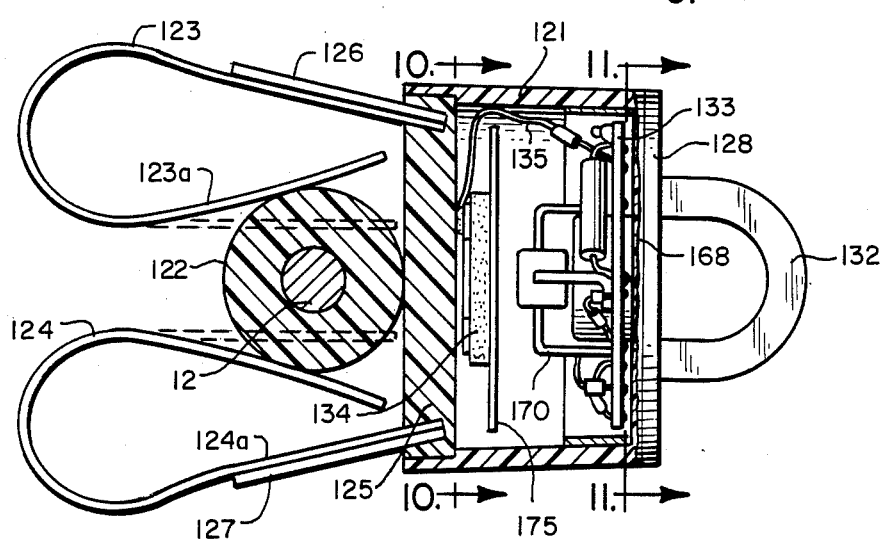
FIG. 9 is a cross-sectional view of the fault indicator taken along line 9—9 of FIG. 8.

As shown to best advantage in FIG. 9, upon insertion of cable 122 between the retaining members, the ends of the retaining members are forced apart. This allows housing 121 to be pushed up against the cable, and as the cable abuts the housing the end portions of the retaining members push the cable into engagement. This cable attachment aarrangement is described and claimed in the copending application of the present inventor, entitled "Cable Mounted Capacitively-Coupled Circuit Condition Indicating Device", Ser. No. 845,592, filed Mar. 28, 1986.

To provide an indication of fault occurrence, detector 120 includes on the front wall 128 of housing 121 a pair of windows 130 through which an indicator flag assembly 131 provides a visible indication of the occurrence of a fault current. A handling loop 132 having ends anchored in the front wall extends from housing 121 to receive the hooked end of a lineman's tool to facilitate installation and removal of the indicator from cable 122.

The various circuit components of the fault indicator are mounted on a circuit board 133 contained within housing 121. A first electrostatic pick-up point between the detector circuitry and the electric field surrounding conductor 122 is provided by a flat electrically conductive plate 134 positioned within housing 121 near rear wall 125 and electrically connected to the circuitry by a conductor 135. A second electrostatic pick-up point radially displaced from the first pick-up point relative to conductor 12, is provided by an electrically conductive steel ring 139 on the opposite inside surface of housing 121 adjacent and behind front wall 128. This housing construction, which advantageously provides sufficient excitation to the indicator circuitry without the use of external ground plane elements, is described in detail in the aforementioned copending application Ser. No. 845,592 of the present inventor.

Referring to FIG. 12, the circuitry of fault indicator 120 is seen to comprise a first rectifier network comprising a pair of rectifier diodes 140 and 141 connected to the capacitive pickup plate 134 through conductor 135. A second rectifier network comprising a pair of rectifier diodes 142 and 143 are connected through a conductor 144 to the electrically conductive coating 139 providing capacitive coupling to ground. Together, the two rectifier networks provide rectification of the alternating current derived from the electric field surrounding conductor 12 to provide energization of the trip, reset and trip inhibit circuits of fault indicator 120.

The pulsating direct current developed by diodes 140 and 141 during normal current flow in conductor 12 is applied to a trip capacitor 145 and a trip inhibit capacitor 146 connected across the output terminals of the network. A zener diode 147 limits the voltage developed across trip capacitor 145 to the threshold voltage of the zener diode, and a forward-biased diode 148 connected across capacitor 146 limits the voltgge across that device during the charge cycle to the forward drop of the diode, typically in the order of 0.7 volts.

The pulsating direct current developed by diodes 142 and 143 is applied to a reset capacitor 150 connected across the output of the second rectifier network to cause that capacitor to also be charged during normal current flow.

To provide for periodic reset of the fault indicator, capacitor 150 is periodically discharged through the series-connected windings 151 of flag indicator assembly 131. To this end, a silicon controlled rectifier 152 is periodically conditioned into conduction by the discharge of a neon lamp 153 included with a resistor 154 in the gate circuit of the SCR upon the voltage across capacitor 150 exceeding a predetermined threshold level. The neon lamp, because of its relatively high threshold voltage, typically in the order of 60 volts, is particularly attractive as a threshold device. However, it will be appreciated that other devices having appropriate threshold levels, such as one or more avalanche devices, could be used instead.

Following the discharge of reset capacitor 150 through windings 151, the voltage across the capacitor drops, neon lamp 153 extinguishes, and SCR 152 ceases to conduct. Capacitor 150 then begins to recharge until the voltage across reset capacitor 150 again reaches the threshold level of neon lamp 153 and conduction through SCR 152 accomplishes another reset cycle.

Upon occurrence of a fault current in conductor 12, trip capacitor 145 is caused to discharge in a reverse direction through windings 151 of flag indicator assembly 131 through a second silicon controlled rectifier 155. This results from closure of reed switch contacts 156 positioned in close magnetic proximity to cable 122 and connected to the control electrode of SCR 155 through a gate circuit comprising a series resistor 157 and a resistor 158 to ground.

Trip capacitor 145 continues to discharge until the discharge current is no longer sufficient to maintain conduction through SCR 155. Magnetic pole piece 159 of flag indicator assembly 131 however remains biased in a magnetic polarity which maintains the indicator flag 160 thereof in a fault indicating position. Upon restoration of normal current in conductor 12. it remains for the reset circuit of reset capacitor 150 to remagnetize pole piece 159 to opposite magnetic polarities so as to reposition flag indicator 160 to a reset-indicating position.

To prevent false fault current indications as a result of inrush current associated with initial powerup of conductor 12, the fault indicator includes in accordance with the invention the trip inhibit capacitor 146 and its associated circuitry for discharging trip capacitor 145 upon loss of voltage on the conductor. In particular the control electrodes of an enhanced FET-type 161 are connected across trip inhibit capacitor 146 through a resistor 162 Upon loss of excitation trip capacitor 145 is caused to partially discharge through a resistor 163 into capacitor 146, causing the voltage across that device to reverse polarity and progressively increase in the reverse direction as the device is charged. Eventually the threshold voltage of transistor 161 is reached and the transistor is rendered conductive by the applied bias from capacitor 146 causing trip capacitor 145 to rapidly discharge through a resistor 164 and there be unavailable for providing trip current to windings 151 upon conduction by SCR 155. Thus, the fault indicator is initially non-responsive to fault current occurring following the loss of voltage in conductor 12, and does not become operative for this purpose until capacitor 145 again becomes charged.

The operation of flag indicator assembly 131 is illustrated in FIGS. 13-16. The indicator which may be identical in construction and operation to that described in U.S. Pat. No. 4,495,489 of the present inventor, is seen to include an indicator flag 165 rotatably mounted on a shaft 166 within housing 121. The indicator flag includes indicator segments 165a and 165b on either side of the axis of rotation which preferably each extend less than 90° around the axis of rotation.

Figure 13A:
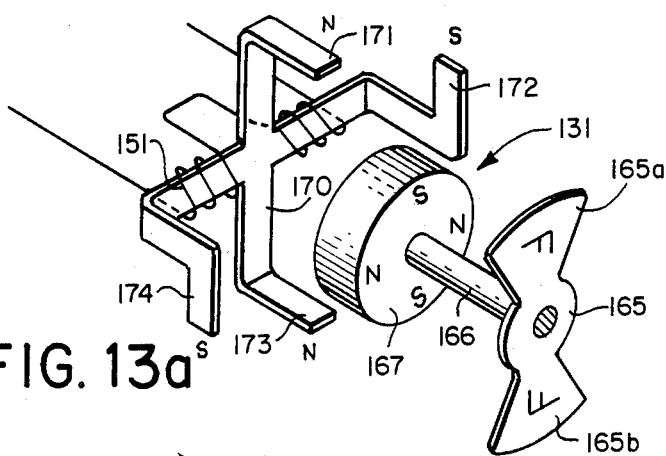
FIGS. 13a and 13b are diagrammatic views of principal indicator components of the fault indicator illustrated in FIGS. 8 and 9 in a reset state.
Figure 13B:
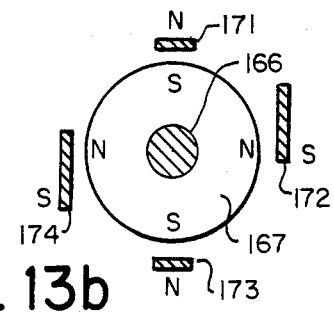
Figure 14A:
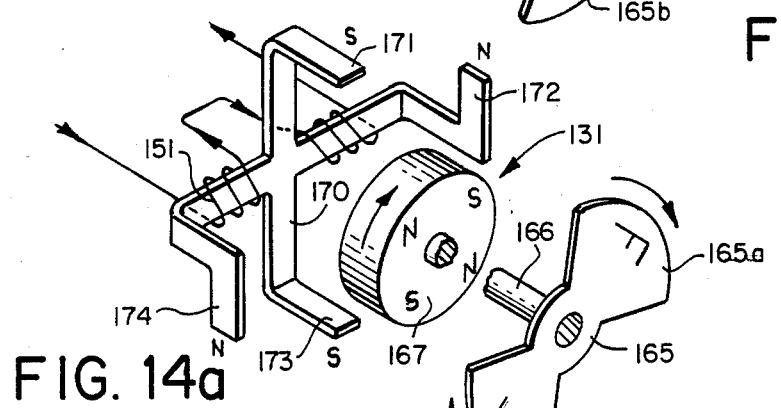
FIGS. 14a and 14b are diagrammatic views similar to FIGS. 13a and 13b, respectively, showing the indicator components of the fault indicator in transition between a reset state and a tripped state.
Figure 14B:
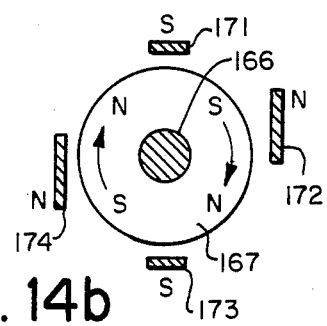
Figure 15A:
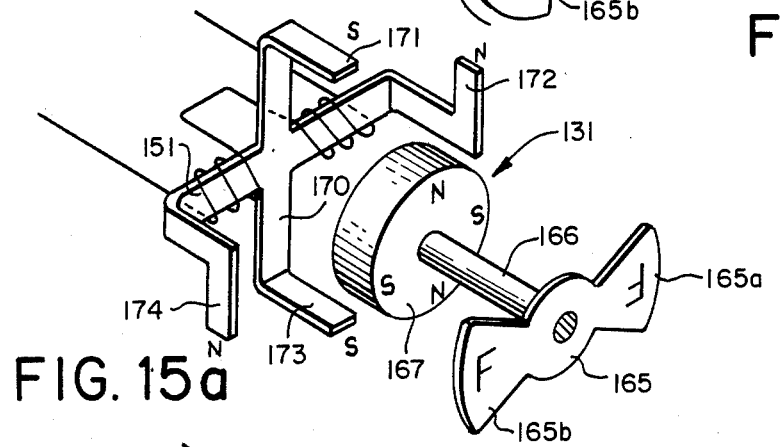
FIGS. 15a and 15b are diagrammatic views similar to FIGS. 13a and 13b, respectively, showing the indicator components of the fault indicator in a tripped state.
Figure 15B:
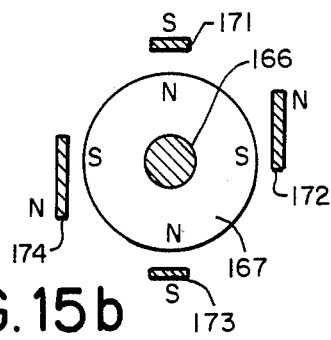

When aligned as shown in FIGS. 13a-13b the flag segments are masked and are not visible to the observer through windows 130. However, upon occurrence of a fault current, the indicator flag rotates 90° such that the indicator segments are positioned as shown in FIGS. 15a-15b and are visible through windows 130. The indicator segments are preferably colored red, or another highly visible color, to clearly indicate the occurrence of a fault current when viewed through the windows.

Actuation of flag member 165 between reset and fault indicating positions is accomplished by an annular flag actuator magnet 167 which is rotatably coupled to flag member 165 by shaft 166. The shaft is maintained in alignment with the axis of indicator housing 121 by means of a bearing surface in a divider wall 168 (FIG. 9) which also provides a reset-indicating surface viewable through windows 70 when the indicator flag is in its reset position. This surface is preferably colored white, or some other color contrasting with the color of the indicator flag segments, to clearly indicate a reset condition when viewed through the windows.

Actuator magnet 167, which may be formed of a magnetic material having a high coercive force, such as ceramic, is formed to provide four magnetic poles of opposite polarity, with opposite polarities every 90° about the circumference of the magnet. Actuator magnet 167, and hence indicator flag 165, are biased to the position shown in FIGS. 13a and 13b when the fault indicator 120 is in a non-trip or reset condition by means of a generally cross-shaped magnetic pole piece 170, formed of a magnetic material having a relatively low coercive force, such as chrome steel. The pole piece includes four magnetic poles 171-174 in magnetic communication with flag actuator magnet 167. The pole piece 170 is mounted such that the four magnetic poles extend to positions adjacent the magnetic poles of actuator magnet 167, a magnetic shield 175 (FIGS. 9 and 10) comprising a flat plate of magnetically conductive material is provided between the actuator assembly and conductor 12 to shield the actuator assembly from the magnetic field which accompanies occurrence of a fault current in conductor 12.

During normal circuit operation the poles of pole piece 170 are biased to the magnetic polarities indicated in FIGS. 13a and 13b. As a result, the opposite polarity poles of flag actuator magnet 167 are attracted to position the indicator flag 165 as shown, with the indicator segments thereof vertically aligned and out-of-view of windows 70. Thus, all that is seen is the white reset-indicating surface of divider 168.

Upon loss of voltage in conductor 12, pole piece 170 is remagnetized to the magnetic polarities shown in FIGS. 14a-14b and 15a-15b by momentary energization of magnetic windings 151, which are located on the pole piece, as shown. As a result, the poles of flag actuator magnet 167 are repelled by adjacent like-polarity poles of the pole piece and the indicator flag is caused to rotate 90° to the indicating position shown in FIGS. 15a-15b. In this position the red indicator segments 165a and 165b of the indicator flag 165 are visible through windows 70 and a lineman viewing the fault indicator is advised that a fault current has occurred in conductor 12.

Figure 16A:
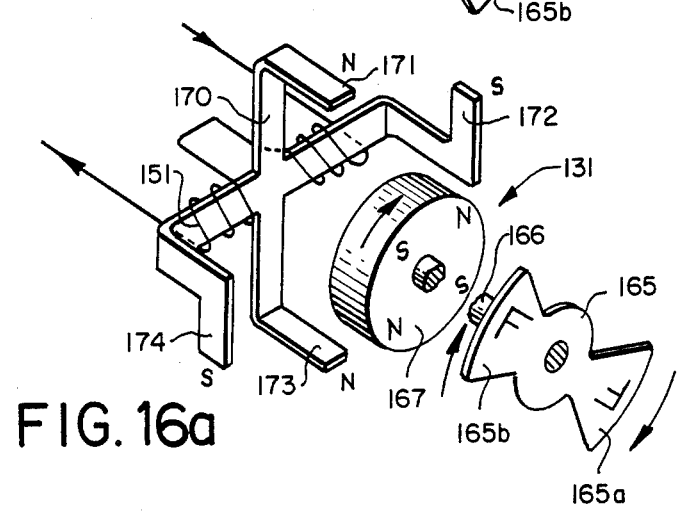
FIGS. 16a and 16b are diagrammatic views similar to FIGS. 13a and 13b, respectively, showing the indicator components of the fault indicator in transition between a tripped state and a reset state.
Figure 16B:
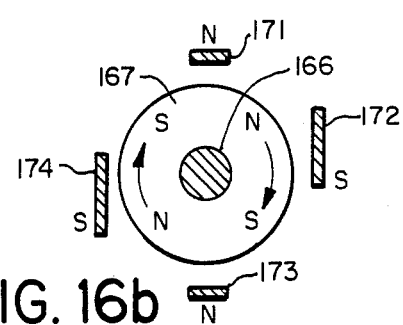

The indicator flag 165 remains in the fault-indicating position until the poles of pole piece 170 are subsequently remagnetized to the magnetic polarity shown in FIGS. 13a-13b by momentary application of a reset current to windings 151 as shown in FIGS. 16a-16b. This causes flag actuator magnet 167 to again be repelled by the adjacent poles of pole piece 170 so as to rotate indicator flag 165 to a vertical position, as shown in FIGS. 13a-13 b.

The high input impedance provided by the invention allows the fault indicator to be utilized on test points where coupling to a monitored conductor may rang from 5 to only 1 picofarad, and on high voltage cables, where coupling to the conductor may be only 0.5 picofarad, without the need for external grounding connections or electrically conductive members projecting from the housing.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating the occurrence of a fault current in an electrical conductor of an alternating current distribution power system, wherein the conductor is subject to inrush current levels in excess of fault current levels upon power up of the conductor, comprising:

status indicating means having reset-indicating and fault-indicating states;

a trip capacitor;

trip circuit means operable from said trip capacitor for conditioning said status indicating means to said fault-indicating state in response to the occurrence of a fault current in the conductor;

a trip inhibit capacitor;

charge circuit means powered by alternating current in the monitored conductor for developing a charge current for charging said trip capacitor to a predetermined charge level;

delay circuit means operable upon interruption of said charge current for establishing current flow between said trip capacitor and said trip inhibit capacitor, the terminal voltage across said trip inhibit capacitor progressively increasing with said current flow; and trip inhibit circuit means responsive to the voltage across said trip capacitor increasing beyond a predetermined threshold level for discharging said trip capacitor to render said trip circuit means inoperative and the fault indicator non-responsive to inrush current in the conductor.

2. A fault indicator as defined in claim 1 wherein the capacitance of said trip inhibit capacitor is substantially less than the capacitance of said trip capacitor.

3. A fault indicator as defined in claim 1 wherein said charge circuit means comprise a circuit capacitively coupled to the monitored conductor.

4. A fault indicator as defined in claim 3 wherein said trip and trip inhibit capacitors are connected in series across the output of said rectifier circuit, and wherein are included voltage limiting means connected across said trip inhibit capacitor for limiting the voltage developed across said capacitor by said charge current.

5. A fault indicator as defined in claim 4 wherein said delay means comprise a resistor connected between the unconnected terminals of said capacitors.

6. A fault indicator as defined in claim 1 wherein said trigger circuit means comprise a control effect generating device and a transistor, said transistor having a first main electrode connected to the connected terminal of said capacitors, and a second main electrode connected through said generating device to the non-connected terminal of said trip capacitor, and a gate electrode connected to the non-connected terminal of said trip inhibit capacitor, and further having between said gate electrode and said first main electrode a threshold voltage level above which conduction is initiated between said main electrodes.

7. A fault indicator as defined in claim 6 wherein said transistor is a field effect transistor.

8. A fault indicator as defined in claim 6 wherein said control effect generating device comprises a relay having at least one set of contacts actuated by the discharge current produced by said trip capacitor.

9. A fault indicator as defined in claim 5 wherein said charge circuit means provide recurring unidirectional current pulses, and the time constant of said charge transfer circuit formed by said trip and trip inhibit capacitors and said resistor sufficiently exceed the pulse period of said charge current pulses such that said trip capacitor remains substantially fully charged between said pulses.

10. A fault indicator as defined in claim 4 wherein said voltage limiting means comprise a diode forward-biased to said charging current.

11. A fault indicator as defined in claim 1 wherein said control effect generating device comprises an electrically actuated indicator flag.

12. A fault indicator for producing a control effect in response to the occurrence of a fault current in a monitored conductor, comprising:
    status indicating means having reset-indicating and fault-indicating states;
    trip circuit means including a trip capacitor for utilizing the charge stored in said trip capacitor to condition said status indicating means to said fault-indicating state in response to the occurrence of a fault current in the electrical conductor;
    a trip inhibit capacitor;
    charge circuit means including a rectifier circuit coupled to the monitored conductor for developing a charge current for charging said capacitors, said trip and trip inhibit capacitors being connected in series across the output of said rectifier circuit to receive said charge current;
    voltage limiting means comprising a diode forward-biased to said charge current and connected across said trip inhibit capacitor for limiting the voltage developed thereacross by said charge current to a predetermined nominal level;
    circuit means including a resistor connected between the unconnected terminals of said capacitors, said circuit means being operable upon interruption of said charge current for establishing current flow between said trip capacitor and said trip inhibit capacitor, the terminal voltage across said trip inhibit capacitor progressively increasing from said predetermined nominal level with said current flow; and
    trigger circuit means responsive to the voltage across said trip inhibit capacitor increasing beyond a predetermined threshold level for discharging said trip capacitor to render said trip circuit means inoperative and the fault indicator non-responsive to inrush current in the conductor.

13. A fault indicator as defined in claim 12 wherein the capacitance of said trip inhibit capacitor is substantially less than the capacitance of trip first capacitor.

14. A fault indicator as defined in claim 12 wherein said trigger circuit means comprise a control effect generating device and a transistor, said transistor having a first main electrode connected to the connected terminal of said capacitors, and a second main electrode connected through said generating device to the non-connected terminal of said trip capacitor, and a gate electrode connected to the non-connected terminal of said trip inhibit capacitor, and further having between said gate electrode and said first main electrode a threshold voltage level above which conduction is initiated between said main electrodes.

15. A fault indicator as defined in claim 14 wherein said transistor is a field effect transistor.

16. A fault indicator as defined in claim 12 wherein said charge circuit means provide recurring unidirectional current pulses, and the time constant of said charge transfer circuit formed by said trip and trip inhibit capacitors and said resistor sufficiently exceed the pulse period of said charge current pulses such that said trip capacitor remains substantially fully charged between said pulses.

17. A fault indicator as defined in claim 12 wherein said control effect generating device comprises an electrically actuated indicator flag.

18. A fault indicator for producing a control effect in response to the occurrence of a fault current in a monitored conductor, comprising:
    status indicating means having reset-indicating and fault-indicating states;
    trip circuit means including a trip capacitor for utilizing the charge stored in said trip capacitor to condition said status indicating means to said fault-indicating state in response to the occurrence of a fault current in the electrical conductor;
    a trip inhibit capacitor;
    charge current means including a rectifier circuit coupled to the monitored conductor for developing a charge current for charging said capacitors, said capacitors being connected in series across the output of said rectifier circuit to receive said charge current;
    voltage limiting means comprising a diode forward-biased to said charge current and connected across said trip inhibit capacitor for limiting the voltage developed thereacross by said charge current to a predetermined nominal level; and trigger circuit means including a field effect transistor having a first main electrode connected to the connected terminals of said capacitors, and a second main electrode connected througth a discharge current limiting resistor to the non-connected terminal of said trip capacitor, and a gate electrode connected to the non-connected terminal of said trip inhibit capacitor, and further having between said gate electrode and said first main electrode a threshold voltage level above which conduction is initiated between said main electrodes, for discharging said trip capacitor through said discharge current limiting resistor to render said trip circuit means inoperative and the fault indicator non-responsive to inrush current in the conductor.

19. A fault indicator as defined in claim 18 wherein the capacitance of said trip inhibit capacitor is substantially less than the capacitance of said trip capacitor.

20. A fault indicator as defined in claim 18 wherein said charge circuit means provide recurring unidirectional current pulses, and the time constant of said delay circuit sufficiently exceeds the pulse period of said charge current pulses such that said trip capacitor remains substantially fully charged between said pulses.

* * * * *